United States Patent
Wu et al.

(10) Patent No.: US 12,288,974 B2
(45) Date of Patent: Apr. 29, 2025

(54) OVER-CURRENT PROTECTION SYSTEM

(71) Applicant: VALEO AUTOMOTIVE AIR CONDITIONING HUBEI CO., LTD., Hubei (CN)

(72) Inventors: Qiaozheng Wu, Hubei (CN); Fei Liu, Hubei (CN); Xiaohui Liu, Hubei (CN)

(73) Assignee: VALEO AUTOMOTIVE AIR CONDITIONING HUBEI CO. LTD, Hubei (CN)

( * ) Notice: Subject to any disclaimer, the term of this patent is extended or adjusted under 35 U.S.C. 154(b) by 161 days.

(21) Appl. No.: 17/916,945

(22) PCT Filed: Apr. 6, 2021

(86) PCT No.: PCT/CN2021/085642
§ 371 (c)(1),
(2) Date: Oct. 4, 2022

(87) PCT Pub. No.: WO2021/204110
PCT Pub. Date: Oct. 14, 2021

(65) Prior Publication Data
US 2023/0155365 A1    May 18, 2023

(30) Foreign Application Priority Data
Apr. 8, 2020 (CN) .......................... 202010268082.3

(51) Int. Cl.
*H02H 3/08* (2006.01)
*H02H 3/02* (2006.01)
*H02H 3/06* (2006.01)

(52) U.S. Cl.
CPC .............. *H02H 3/08* (2013.01); *H02H 3/021* (2013.01); *H02H 3/06* (2013.01); *H03K 2217/0027* (2013.01)

(58) Field of Classification Search
CPC .. H02H 3/08; H02H 3/02; H02H 3/06; H02H 3/021; H02H 7/20; H02H 3/066; B60L 3/04; H03K 2217/0027; H03H 3/087
(Continued)

(56) References Cited

U.S. PATENT DOCUMENTS 9,490,623 B2   11/2016  Marotta et al.
2007/0229041 A1  10/2007  Oki et al.
(Continued)

FOREIGN PATENT DOCUMENTS

CN       1954469 A    4/2007
CN     104332943 A    2/2015
(Continued)

OTHER PUBLICATIONS

National Intellectual Property Administration (ISA/CN), International Search Report and Written Opinion of corresponding International Application No. PCT/CN2021/085642, dated Jun. 3, 2021.
(Continued)

*Primary Examiner* — Danny Nguyen
(74) *Attorney, Agent, or Firm* — VALEO AUTOMOTIVE AIR CONDITIONING HUBEI CO. LTD

(57) ABSTRACT

The invention herein provides an over-current protection system. The over-current protection system includes a sensing device, a comparator, a first transistor, and a second transistor. The sensing device is adapted to sense current flowing to an electrical device. The comparator is adapted to compare a signal received from the sensing device and a reference signal to generate any one of high signal and low signal, the output of the comparator being connected to a control device. The first transistor connected to the output signal of the comparator to control the first transistor, while the first transistor is in a conductive state when the output signal of the comparator is high signal. The second transistor connected to and controlled by the first transistor, while the second transistor is in a conductive state when the first transistor is in the conductive state.

9 Claims, 4 Drawing Sheets

(58) Field of Classification Search
USPC .................................. 361/86–87, 93.7–93.9
See application file for complete search history.

(56) References Cited

U.S. PATENT DOCUMENTS

| | | | | |
|---|---|---|---|---|
| 2012/0299689 | A1* | 11/2012 | Wang | H05B 1/0269 337/1 |
| 2013/0214805 | A1* | 8/2013 | Saloio, Jr. | H02J 7/243 324/750.01 |
| 2015/0372671 | A1* | 12/2015 | Akahane | H03K 17/168 327/109 |
| 2018/0294635 | A1* | 10/2018 | Kozuki | H02H 3/085 |

FOREIGN PATENT DOCUMENTS

| | | | |
|---|---|---|---|
| CN | 106451341 | A | 2/2017 |
| JP | H1118422 | A | 1/1999 |
| JP | 2000166227 | A | 6/2000 |

OTHER PUBLICATIONS

National Intellectual Property Administration (ISA/CN), Second Office Action (including English translation) of corresponding Chinese Application No. 202010268082.3, dated Sep. 26, 2022.
National Intellectual Property Administration (ISA/CN), First Office Action (including English translation) of corresponding Chinese Application No. 202010268082.3, dated Jan. 29, 2022.
National Intellectual Property Administration (ISA/CN), First Search of corresponding Chinese Application No. 202010268082.3, dated Jan. 20, 2022.

* cited by examiner

OVER-CURRENT PROTECTION SYSTEM

CROSS-REFERENCE TO RELATED APPLICATIONS

This application is filed under 35 U.S.C. § 371 U.S. National Phase of International Application No. PCT/CN2021/085642 filed Apr. 6, 2021 (published as WO2021204110), which claims priority benefit to Chinese Application No. 202010268082.3 filed on Apr. 8, 2020, the disclosures of which are herein incorporated by reference in their entirety.

TECHNICAL FIELD

The present invention generally relates to an over-current protection system for an electrical device connected in a circuit, more particularly, to an over-current protection system that connects and disconnects the electrical devices to and from the circuit during any abnormal conditions in the circuit.

BACKGROUND OF THE INVENTION

Generally, electrical devices are connected to a power source through a switching device to have controlled environment of the circuit. Sometimes, the circuit can experience with over-current flow due to short circuit or any other fault, which can damage the electrical devices and switching devices. To avoid such scenario, an over-current protection device is introduced to the circuit. The over-current protection device can disconnect the electrical devices from the circuit to avoid damages of the electrical devices while the circuit is experiencing over-current flow conditions thereon. The over-current protection device can include switching devices such as transistors to disconnect the electrical devices from the circuit experiencing over current. However, such over-current protection devices may not be efficient, since the switching devices in the device may not be stable. The switching devices may be unstable due to the electromagnetic interference of ground in the switching devices, which may affect the performance of the over-current protection devices. Therefore, such over-current protection devices may not efficiently disconnect the electrical devices from the circuit, so it may tend to damage the electrical devices.

Further, such over-current protection devices do not provide reset function, which reconnects the electrical devices to the circuit, once the over-current situation is restored without any external intervention. For example, the conventional over-current protection devices may disconnect the electrical devices from the circuit, when any over-current flows in the circuit due to any fault or short circuit, however, such devices do not reconnect the electrical devices back to the circuit, when the current flows in the circuit becomes normal again. Although the current flowing in the circuit reduces below a threshold level, the over-current protection devices do not reconnect the electrical devices back to the circuit. It requires an external intervention to reconnect the electrical devices back to the circuit, hence the conventional cover-current protection devices are not efficient to optimally operate the circuit.

Accordingly, there remains a need for an over-current protection device that effectively connects and disconnects any electrical devices to/from a circuit during normal and faulty conditions. Further, there remains a need for a device that can withstand any electromagnetic interferences. Further, there remains another need for a protection system that reset the circuit without any external intervention.

An object of the present invention is to provide a device connected in a circuit to have controlled environment in the circuit when the circuit is unstable.

Another object of the present invention is to provide an over-current protection device that disconnects an electrical device from a circuit when the current flowing in the circuit is more than of a threshold value, and reconnects the electrical device to the circuit when the current flowing in the circuit is less than of the threshold value.

Yet another object of the present invention is to provide an over-current protection system that protects electrical devices connected in a circuit when any abnormalities occurred in the circuit.

BRIEF SUMMARY OF THE INVENTION

In view of the foregoing, an embodiment of the invention herein provides an over-current protection system. The over-current protection system includes a sensing device, at least one comparator, at least one first transistor, and at least one second transistor. The sensing device is adapted to sense current flowing to an electrical device. The at least one comparator adapted to compare a signal received from the sensing device and a reference signal to generate any one of high signal and low signal, wherein the output of the at least one comparator is connected to a control device through. The at least one first transistor connected to the output signal of the at least one comparator to control the at least one first transistor, wherein the at least one first transistor is in a conductive state when the output signal of the at least one comparator is high signal. The at least one second transistor connected to and controlled by the at least one first transistor, wherein the at least one second transistor is in a conductive state when the at least one first transistor is in the conductive state. Further, the output of the comparator is grounded through the at least one second transistor when the at least one second transistor is in the conductive state. In one embodiment, the output of the at least one comparator is connected to the control device through the first resistor to reduce the current/voltage flowing to the control device, in order to protect the control device from high voltage/current than of operating voltage/current of the control device. The grounded output of the comparator can be a low signal.

Further, the over-current protection system includes a third transistor connected to the at least one first transistor and adapted to control the at least one first transistor, when the output signal of the at least one comparator is a low signal.

In one embodiment, a base terminal of the at least one first transistor is connected to both of the output of the at least one comparator through a second resistor and the collector terminal of the third transistor to control the at least one first transistor.

In another embodiment, a base terminal of the at least one second transistor is connected to a collector terminal of the at least one first transistor to control the at least one second transistor.

In one example, the first transistor and the third transistor are PNP type transistors and the second transistor is a NPN type transistor.

In one embodiment, the at least one comparator generates the high signal when the detected signal is less than of the reference signal, and the at least one comparator generates low signal when the detected signal is more than of the reference signal.

Further, the over-current protection system includes a voltage regulator connected to the third transistor to control the third transistor.

According to another aspect of the invention, a method for operating an over-current protection system is provided. The method in following steps. First, current flowing to an electrical device is detected and a signal is provided to an at least one comparator. The detected signal is compared with a reference signal by a comparator. Further, any one of high signal and low signal is generated based on the comparison between the detected signal and the reference signal, wherein the comparator generates low signal when the detected signal is more than of the reference signal. Thereafter, a first transistor and a second transistor is turned into a conductive state when the first transistor receives the low signal from the at least one comparator. Further, the output signal of the at least one comparator is grounded through the second transistor that restricts the output signal flow to a control device and turns the control device into a non-conductive state. Further, the electrical device is disconnected from a power source.

In one embodiment, a third transistor is turned into the first transistor and second transistor into a non-conductive state when the at least one comparator generates a high signal. Further, the high signal of the at least one comparator is provided to the control device to turn the control device in a conductive state, thereby connecting the electrical device to the power source. In one embodiment, the third transistor is controlled by a voltage regulator.

BRIEF DESCRIPTION OF THE DRAWINGS

Other characteristics, details and advantages of the invention can be inferred from the description of the invention hereunder. A more complete appreciation of the invention and many of the attendant advantages thereof will be readily obtained as the same becomes better understood by reference to the following detailed description when considered in connection with the accompanying figures, wherein.

DETAILED DESCRIPTION OF THE INVENTION

It must be noted that the figures disclose the invention in a detailed enough way to be implemented, the figures helping to better define the invention if needs be. The invention should however not be limited to the embodiment disclosed in the description.

The present invention relates to an over-current protection system provided in a circuit to control electrical devices connected in the circuit. For example, the circuit can connected to an electrical heater, and the over-current protection system is connected to the circuit to control the electrical heater. Forthcoming description of the over-current protection system in this document is explained with respect to the electrical heater, however, such over-current protection system can used to control any other electrical devices connected in a circuit. The over-current protection system can act as a switch to disconnect the electrical heater from the circuit, when the circuit is experiencing a current flow value above a threshold value, and reconnect the electrical heater back to the circuit, when the current flow in the circuit is restored to a value under the threshold value. Thereby, the over-current protection system provides protection to the electrical heater when the over-current flows in the circuit and increases safety of the circuit. Further, the over-current protection system provides a hassle-free controlling of the electrical heater during the circuit experiencing unstable conditions, such as over-current or short circuit. Further, the construction of the over-current protection system is simple and stable.

Figure 1A:
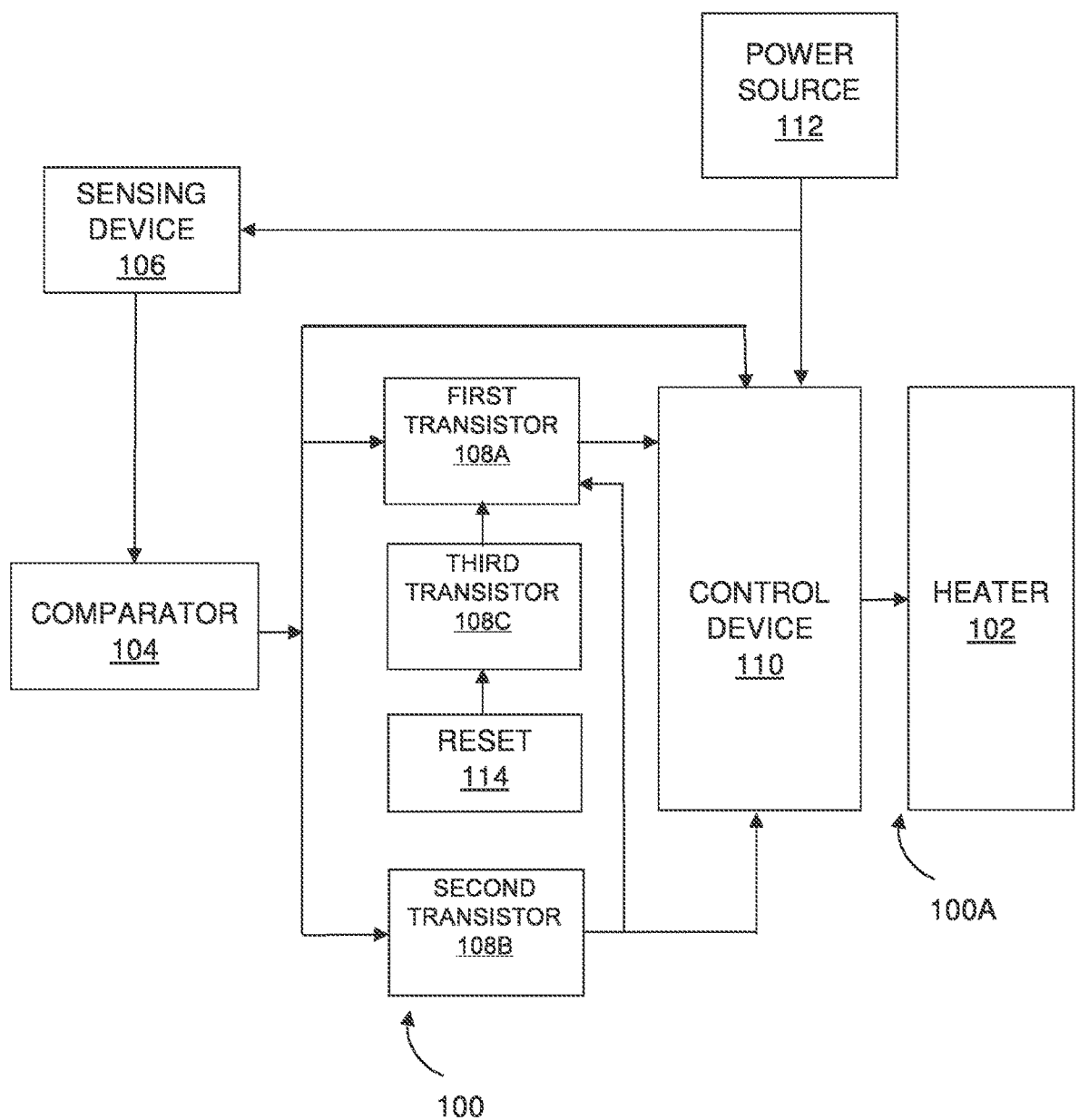
FIG. 1A illustrates a block diagram of an over-current protection system electrically connected in an electrical circuit, in accordance with an embodiment of the present invention.
Figure 1B:
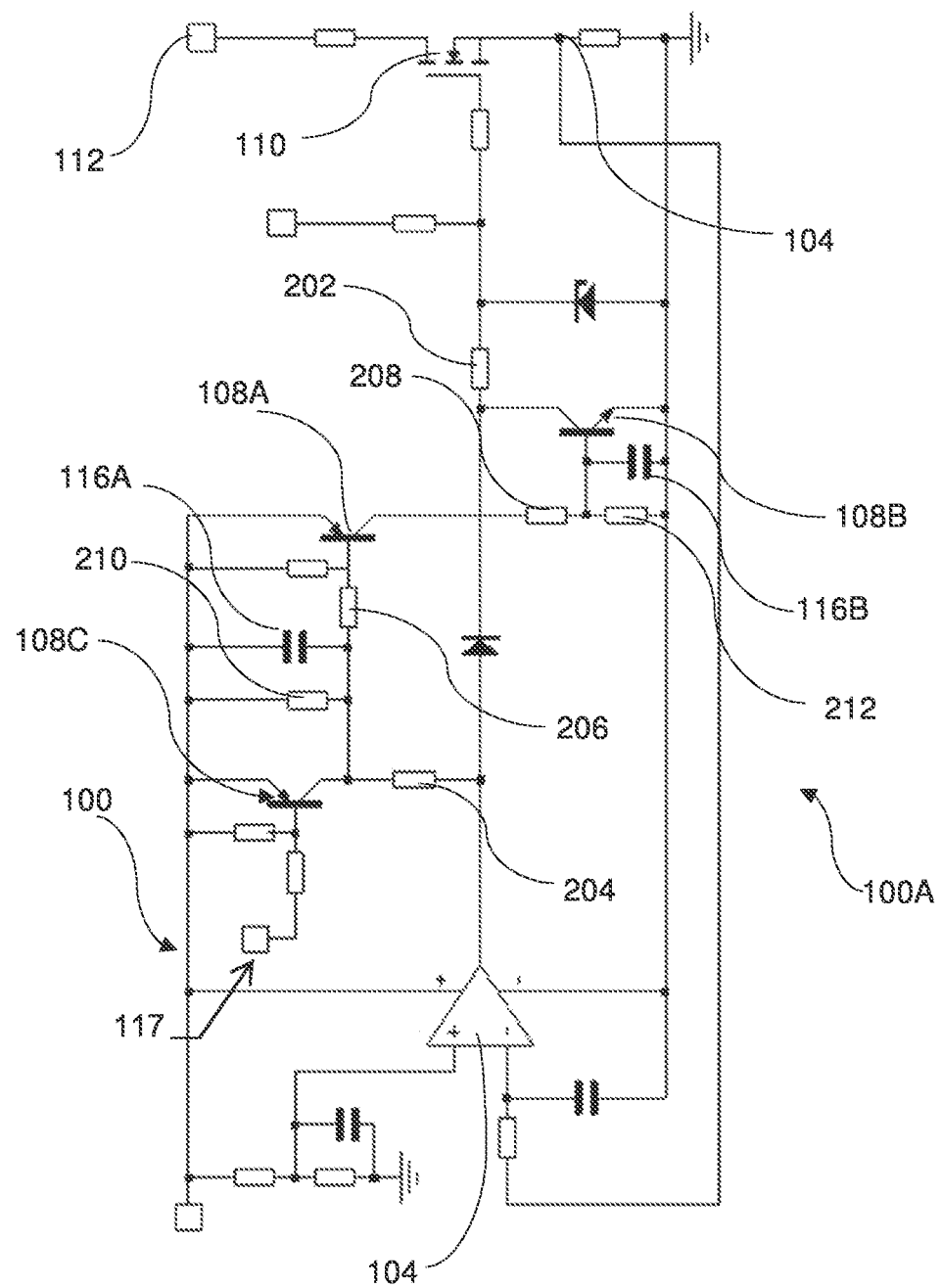
FIG. 1B is a circuit diagram of the over-current protection system of FIG. 1A.

FIGS. 1A and 1B illustrate different schematics of an over-current protection system 100, in accordance with an embodiment of the present invention. The over-current protection system 100 can also be referred to as a protection device. The over-current protection system 100 is connected in a circuit 100A to which an electrical heater 102 is electrically connected. The over-current protection system 100 can act as a controller that effectively controls a control device 110 to connect/disconnect the electrical heater 102 to/from the circuit 100A. In one example, FIG. 1A illustrates a block diagram of the over-current protection system 100 electrically connected in the electrical circuit 100A having the electrical heater 102, and FIG. 1B is a circuit diagram of the over-current protection system 100. The over-current protection system 100 can include at least one comparator 104, a sensing device 106, a plurality of first transistors 108A, a plurality of second transistors 108B, and a plurality of third transistors 108C. In one example, the electrical circuit 100A can include the over-current protection system 100, the electrical heater 102, and the control device 110. In another example, the control device 110 can be a part of the over-current protection system 100. Further, the electrical heater 102 is energized by a power source 112. Ideally, the power source 112 can be a battery pack; however, it does not restrict to use any other power source with the electrical circuit 100A.

Generally, the power source 112 is connected to the electrical heater 102 through the control device 110. The control device 110 is to energize and de-energize the electrical heater 102. In one embodiment, the control device 110 can be any control device, such as Metal Oxide Semiconductor Field Effect Transistor (MOSFET), Integrated Gate Bipolar Transistor (IGBT) etc. The control device 110 can be controlled by the over-current protection system 100 during any abnormality occurring in the electrical circuit 100A. In one embodiment, a gate signal of the control device 110 is generated by the over-current protection system 100, thereby effectively controlling the control device 110. Further, the sensing device 106 can be a shunt or any other sensing device that can sense current flowing in the circuit 100A. The sensing device 106 is provided in between the power source 112 and the electrical heater 102 and is adapted to measure current flowing in the circuit 100A. Further, the sensing device 106 provides a signal to the comparator 104, corresponding to the measured current in the circuit 100A. The signal can indicate current level flowing in the circuit 100A. The comparator 104 is adapted to compare the received signal from the sensing device 106 with a reference signal and accordingly generates a high or low signal. In one example, the comparator 104 generates the high output signal when the signal received from the sensing device 106 is less than of a reference threshold value. In other words, when the received signal from the sensing device 106 is less than of the reference value, the current flowing in the circuit 100A is within the threshold value.

As mentioned above, the over-current protection system 100, hereinafter referred to as protection system, includes at least three set of switches, such as the plurality of first transistors 108A, the plurality of second transistors 108B, and the plurality of third transistors 108C. For the sake of brevity and clarity, forthcoming description in the document is explained with one first transistor, one second transistor and one third transistor. However, it does not restrict the invention to use more than one transistor. In one embodiment, the first transistor 108A and the third transistor 108C are PNP type transistor and the second transistor 108B is a NPN type transistor. The output of the comparator 104 is connected to both the first transistor 108A and the second transistor 108B. In addition, the output of the comparator 104 can be connected to the gate terminal of the control device 110 through a first resistor 202, to control the control device 110. Generally, the output of the comparator 104 provides the gate signal to the control device 110 and causes the control device 110 to be in a conductive state, thereby energizing the electrical heater 102 by the power source 112. Further, the control device 110 receives the gate signal when the comparator 104 generates the high signal, i.e., current flowing in the circuit 100A is within the threshold value; otherwise, the output signal of the comparator 104 is grounded through the first transistor 108A and the second transistor 108B. In case the current flowing in the circuit 100A is more than of the threshold value, the comparator 104 generates the low output signal and the second transistor 108B grounds the low output signal, thereby disconnecting flow of the gate signal to the control device 110 in a locked manner. Hence, the electrical heater 102 stays disconnected from the circuit 100A thereby avoiding damages to the electrical heater 102. Generally, a low signal is a signal having zero voltage/current, and a high signal is a signal having the same voltage/current as the supply voltage/current.

Further, the first transistor 108A is connected with both the third transistor 108C and comparator 104, in such a way that the comparator 104 or the third transistor 108C can control the first transistor 108A. In one embodiment, a base terminal of the first transistor 108A is connected to both of the output of the comparator 104 through a second resistor 204 and a collector terminal of the third transistor 108C. Hence, the first transistor 108A can be controlled of either output of the comparator 104 or the third transistor 108C. In one example, the first transistor 108A is in a conductive state when the output signal of the comparator 104 is the low signal and the third transistor 108C is in the non-conductive state. In another example, the first transistor 108A is in a non-conductive state when the output signal of the comparator 104 is the high signal. Further, the first transistor 108A is connected to the second transistor 108B in such a way that the second transistor 108B can be controlled by the first transistor 108A. In one embodiment, the base terminal of the second transistor 108B is connected to a collector terminal of the first transistor 108A, so that the first transistor 108A controls the second transistor 108B. In one embodiment, the second transistor 108B conducts when the base first transistor 108A is in the conductive state, since the base terminal of the second transistor 108B is connected to the collector terminal of the first transistor 108B. Further, the third transistor 108C is connected to a reset module 114 to control the third transistor 108C. In one embodiment, the reset module 114 is a low voltage controller that is connected to a base terminal of the third transistor 108C, thereby controlling the third transistor 108C. The protection system 100 further includes a pair of capacitors 116A, 116B, coupled respectively to the first transistor 108A and the second transistor 108B to improve electromagnetic compatibility to the ground. In one embodiment, the capacitor 116A is connected in parallel to the emitter and base terminals of the first transistor 108A and the capacitor 116B is connected in parallel to the emitter and base terminals of the second transistor 108B.

Referring to FIG. 1B, when current flowing in the circuit 100A is within the threshold value, the comparator 104 receives low signal from the sensing device, generates the high output signal by comparing it with the reference signal. As the first transistor 108A is PNP type transistor, the first transistor 108A is in non-conductive state and the second transistor 108B receives low or nil base signal. As the second transistor 108B is a NPN type transistor, the second transistor 108B is not conducting due to low base signal, thereby the output signal of the comparator 104 is provided to the control device 110 through the second resistor 204. Hence, the circuit 100A operates normally and the electrical heater 102 is energized by the power source 112.

In case the current flowing in the circuit 100A is more than of the threshold voltage, the comparator 104 receives the high signal from the sensing device 106. The comparator 104 generates the low signal after comparing the high signal received from the sensing device 106 and the reference threshold signal. The low signal of the comparator 104 is provided to both the base terminal of the first transistor 108A through the resistors 202, 206 and the collector terminal of the second transistor 108B. As the first transistor 108A is PNP type transistor, the low signal received at the base terminal of the first transistor 108A enables the first transistor 108A to be in the conductive state, so the reference signal flows to the second transistor 108B through the first transistor 108A. Further, a third resistor 210 is connected between the collector and base terminals of the first resistor 108A and having more resistance value than of the second resistor 204. Hence, the low signal from the comparator 104 flows through the second resistor 202 and reaches the base terminal of the first transistor 108A, thereby the base of the first transistor 108A is low, and in conductive state. Further, the reference signal is provided to the base terminal of the second transistor 108B through the fourth resistor 208 to enable the second transistor 108B. As the second transistor 108B is in the conductive state, the output signal of the comparator 104 provided at the collector terminal of the second transistor 108B is grounded through the second transistor 108B. The grounded output signal of the comparator 104 can be a low signal. Further, a fifth resistor 212 is connected between the base terminal of the second transistor 108B and the ground. The fifth transistor 212 has bigger resistance value than the fourth resistor 208, therefore the base terminal of the second transistor 108B receives the high reference signal flowing from the first transistor 108A. The high base signal enables the second transistor 108B to be in conductive state, thereby grounding the output signal of the comparator 104 received at the collector terminal of the second transistor 108A. In one embodiment, the second transistor 108B is in conductive mode and has lower resistance path than of the first resistor 202. Hence, the output signal of the comparator 104 does not reach the gate terminal of the control device 110, thereby causing the control device 110 to be in the non-conductive state. Therefore, the electrical heater 102 is disconnected from the power source 112 and avoids any damage to the circuit 100A and the electrical heater 102 due to the over-current.

Once the current flowing in the circuit 100A is restored to the level, which is within the threshold value, the protection system 100 reconnects the electrical heater 102 back to the circuit 100A without any external physical intervention. To restore the circuit 100A, the third transistor 108C is provided in the protection system 100. Although the current flowing in the circuit is less than of the threshold value, the comparator 104 still has the low output signal for some time, thereby maintaining the first transistor 108A and the second transistor 108B in the conductive state. To turn the first transistor 108A and the second transistor 108B, the third transistor 108C is turned into the conducting state by the reset module 114. In one embodiment, the reset module 114 includes a voltage regulator 117. The voltage regulator 117 provides a low base signal to the base terminal of the third transistor 108C, and maintains the third transistor 108C in the conductive state. The third resistor 210 is short circuited, so the reference signal flows to the base terminal of the first transistor 108A through the third transistor 108C. Further, the base terminal of the first transistor 108A is high, which turn the first transistor 108A into the non-conductive state. As the first transistor 108A is in non-conductive state, the base signal flow to the second transistor 108B is disconnected, thereby turning the second transistor 108B to the non-conductive state. Therefore, the output of the comparator 104 is not grounded anymore. Simultaneously, the output of the comparator 104 is changed to the high signal from the low signal, and provided to the high signal to the control device 110. The control device 110 reconnects the electrical heater 102 back to the power source 112, thereby ensuring that the circuit 110A functions normally. In one embodiment, the third transistor 108C can be NPN type transistor. In such case, the voltage regulator 114 generates a high signal to turn the third transistor 108C into conductive state.

Figure 2:
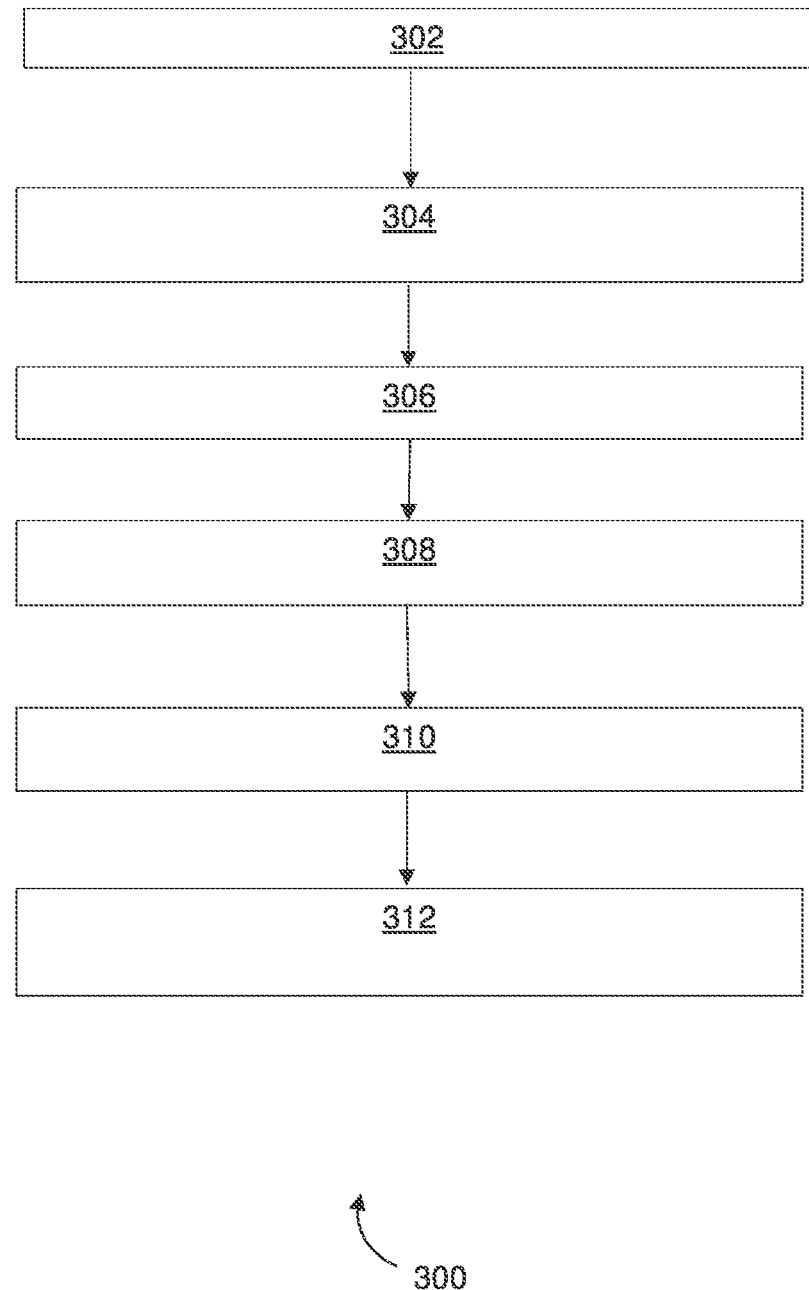
FIG. 2 is a first flow diagram illustrating a method of operating the over-current protection system, in accordance with an embodiment of the present invention.
Figure 3:
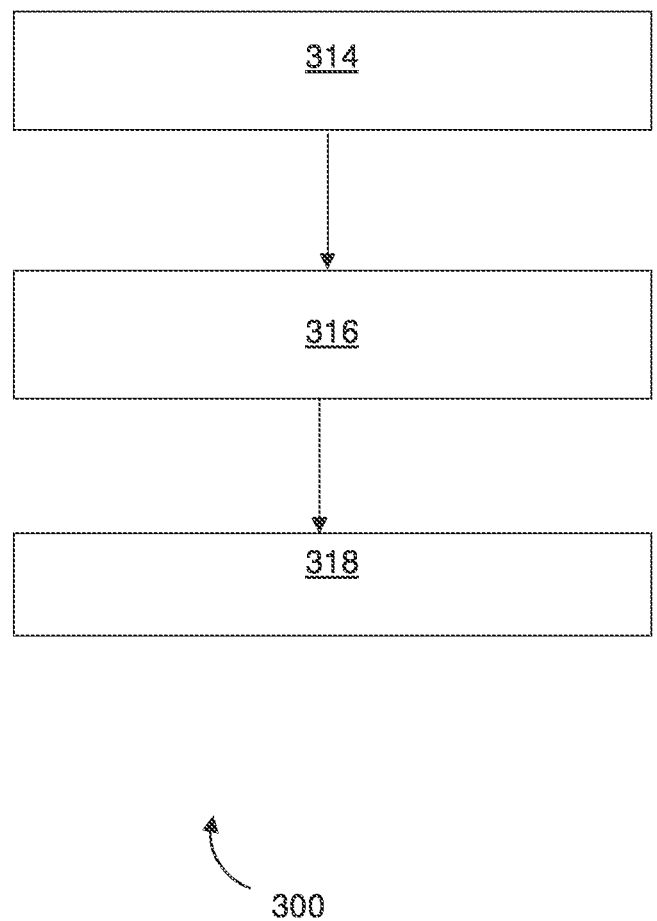
FIG. 3 is a second flow diagram illustrating a method of operating the over-current protection system, in accordance with an embodiment of the present invention.

FIGS. 2 and 3 illustrate a method 300 of operating an over-current protection system 100, in accordance with an embodiment of the present invention. Furthermore, the method 300 can be employed in any suitable hardware, switching devices, sensing devices or any combination thereof. For example, the method 300 can perform following steps to protect any electrical devices while over-current flows to the electrical devices. The method 300 is to be understood with reference to the details described along with FIGS. 1A and 1B.

Method 300 begins at block 302. At block 302, the current flowing to the electrical device 102 is detected and a corresponding signal is provided to the comparator 104. The sensing device 106 can determine the current flowing in the circuit 100A. At block 304, the signal received from the sensing device 106 is compared with a reference signal by the comparator 104. At block 306, any one of high or low signal is generated by the comparator 104 based on the comparison between the detected signal and the reference signal, the reference signal being a threshold value. The comparator 104 generates the low signal when the current flowing to the electrical device 102 is more than of the threshold value. As mentioned above, the threshold value is same value as of the reference signal. At block 308, the first transistor 108A and the second transistor 108B are turned into conductive state when the first transistor 108A receives the low signal from the comparator 104. As the low signal is provided to the first transistor 108A, the first transistor 108A turns into the conductive state, thereby enabling the second transistor 108B into the conductive state. At block 310, the output low signal of the comparator 104 is grounded through the second transistor 108B that restricts flow of output signal to a control device 110 and turns of the control device 110 into non-conductive state. As the control device 110 is in non-conductive state, the electrical device 102 is disconnected from the power source 112, at block 312, thereby protecting the electrical device 102 from damage when the over-current flowing to the electrical device 102.

Referring to FIG. 3, the over-current protection system 100 reconnects or resets the electrical device 102 back to the power source 112. Following blocks explain the method 300 for reconnecting the electrical device 102 to the power source 112. At block 314, the third transistor 108C is turned into conductive state by a voltage regulator to turn the first transistor 108A and the second transistor 108B into the non-conductive state. Further, the third transistor 108C is in conductive state when the output of the comparator 104 is the high signal. At block 316, the high signal of the comparator 104 to the control device 110 to turn the control device 110 into the conductive state, thereby reconnecting the electrical device into the power source 112, at block 318.

Therefore, the over-current protection system 100 protects the electrical devices 102 connected in the circuit 100A when the circuit 100A is experiencing over-current conditions and resets the circuit 100A when the circuit 100A is restored with stable current, without any external intervention.

In any case, the invention cannot and should not be limited to the embodiments specifically described in this document, as other embodiments might exist. The invention shall spread to any equivalent means and any technically operating combination of means.

What is claimed is:

1. An over-current protection system, comprising:
   a sensing device adapted to sense current flowing to an electrical device;
   at least one comparator adapted to compare a signal received from the sensing device and a reference signal to generate any one of high signal and low signal, wherein the output of the at least one comparator is connected to a control device to connect and disconnect the electrical device from a power source;
   at least one first transistor connected to the output signal of the at least one comparator to control the at least one first transistor, wherein the at least one first transistor is in a conductive state when the output signal of the at least one comparator is a high signal;
   at least one second transistor connected to and controlled by the at least one first transistor, wherein the at least one second transistor is in a conductive state when the at least one first transistor is in the conductive state, wherein the over-current protection system is configured so that the output of the at least one comparator is grounded through the at least one second transistor when the at least one second transistor is in the conductive state; and
   a third transistor connected to the at least one first transistor and adapted to control the at least one first transistor, when the output signal of the at least one comparator is a low signal,
   wherein a base terminal of the at least one first transistor is connected to both of the output of the at least one comparator through a second resistor and a collector terminal of the third transistor to control the at least one first transistor.

2. The over-current protection system as claimed in claim 1, wherein a base terminal of the at least one second transistor is connected to a collector terminal of the at least one first transistor to control the at least one second transistor.

3. The over-current protection system as claimed in claim 1, wherein the at least one first transistor and the at least one third transistor are PNP type transistors and the second transistor is a NPN type transistor.

4. The over-current protection system as claimed in claim 1, wherein the at least one comparator generates the high signal when the detected signal is less than of the reference signal, and the at least one comparator generates low signal when the detected signal is more than of the reference signal.

5. The over-current protection system as claimed in claim 1, further comprising a reset module having a voltage regulator connected to the third transistor to control the third transistor.

6. The over-current protection system as claimed in claim 1, further comprising at least two capacitors, each respectively connected in parallel to the emitter and base terminals of the at least one first transistor and the at least one second transistor.

7. An electrical heater comprising the over current protection system including:
   a sensing device adapted to sense current flowing to an electrical device;
   at least one comparator adapted to compare a signal received from the sensing device and a reference signal to generate any one of high signal and low signal, wherein the output of the at least one comparator is connected to a control device to connect and disconnect the electrical device from a power source;
   at least one first transistor connected to the output signal of the at least one comparator to control the at least one first transistor, wherein the at least one first transistor is in a conductive state when the output signal of the at least one comparator is a high signal;
   at least one second transistor connected to and controlled by the at least one first transistor, wherein the at least one second transistor is in a conductive state when the at least one first transistor is in the conductive state, wherein the over-current protection system is configured so that the output of the at least one comparator is grounded through the at least one second transistor when the at least one second transistor is in the conductive state; and
   a third transistor connected to the at least one first transistor and adapted to control the at least one first transistor, when the output signal of the at least one comparator is a low signal,
   wherein a base terminal of the at least one first transistor is connected to both of the output of the at least one comparator through a second resistor and a collector terminal of the third transistor to control the at least one first transistor wherein the control device controls a heating load of the electrical heater.

8. A method of operating an over-current protection system including:
   a sensing device adapted to sense current flowing to an electrical device;
   at least one comparator adapted to compare a signal received from the sensing device and a reference signal to generate any one of high signal and low signal, wherein the output of the at least one comparator is connected to a control device to connect and disconnect the electrical device from a power source;
   at least one first transistor connected to the output signal of the at least one comparator to control the at least one first transistor, wherein the at least one first transistor is in a conductive state when the output signal of the at least one comparator is a high signal;
   at least one second transistor connected to and controlled by the at least one first transistor, wherein the at least one second transistor is in a conductive state when the at least one first transistor is in the conductive state, wherein the over-current protection system is configured so that the output of the at least one comparator is grounded through the at least one second transistor when the at least one second transistor is in the conductive state; and
   a third transistor connected to the at least one first transistor and adapted to control the at least one first transistor, when the output signal of the at least one comparator is a low signal,
   wherein a base terminal of the at least one first transistor is connected to both of the output of the at least one comparator through a second resistor and a collector terminal of the third transistor to control the at least one first transistor;
   the method comprising:
   detecting current flowing to the electrical device and provide a signal corresponding to the current detection to the at least one comparator;
   comparing the signal with a reference signal;
   generating any one of high signal and low signal based on the comparison between the detected signal and the reference signal, wherein the at least one comparator generates low signal when the signal is more than the reference signal;
   turning the at least one first transistor and the at least one second transistor to a conductive state when the at least one first transistor receives the low signal from the at least one comparator;
   grounding the output signal of the at least one comparator through the at least one second transistor that restricts the output signal flow to the control device and turns the control device into a non-conductive state; thereby
   disconnecting the electrical device from the power source.

9. The method as claimed in claim 8, further comprising:
   turning the third transistor, the at least one first transistor and the at least one second transistor into a non-conductive state when the at least one comparator generates a high signal; and
   providing the high signal of the at least one comparator to the control device to turn the control device in a conductive state; and
   connecting the electrical device to the power source.

* * * * *